US011237212B2

United States Patent
Chang

(10) Patent No.: US 11,237,212 B2
(45) Date of Patent: Feb. 1, 2022

(54) MULTI-DIMENSIONAL MOTION PERFORMANCE MODELING AND REAL-TIME MONITORING OF A MOTION SYSTEM

(71) Applicant: ARCUS TECHNOLOGY, INC., Livermore, CA (US)

(72) Inventor: Christopher C. Chang, Pleasanton, CA (US)

(73) Assignee: ARCUS TECHNOLOGY, INC., Livermore, CA (US)

( * ) Notice: Subject to any disclaimer, the term of this patent is extended or adjusted under 35 U.S.C. 154(b) by 780 days.

(21) Appl. No.: 15/865,088

(22) Filed: Jan. 8, 2018

(65) Prior Publication Data

US 2018/0196104 A1    Jul. 12, 2018

Related U.S. Application Data

(60) Provisional application No. 62/443,585, filed on Jan. 6, 2017.

(51) Int. Cl.
   *G01R 31/34*  (2020.01)
   *H02P 29/024* (2016.01)
   *G01R 19/00*  (2006.01)

(52) U.S. Cl.
   CPC ....... *G01R 31/343* (2013.01); *G01R 19/0092* (2013.01); *H02P 29/024* (2013.01)

(58) Field of Classification Search
   CPC .. G01R 31/343; G01R 19/0092; H02P 29/024
   See application file for complete search history.

(56) References Cited

U.S. PATENT DOCUMENTS

| | | | |
|---|---|---|---|
| 6,370,957 B1 | 4/2002 | Filippenko et al. | |
| 6,434,512 B1 | 8/2002 | Discenzo | |
| 2005/0007249 A1 | 1/2005 | Eryurek et al. | |
| 2005/0240289 A1 | 10/2005 | Hoyte et al. | |
| 2006/0241910 A1 | 10/2006 | Petchenev et al. | |
| 2007/0067678 A1 | 3/2007 | Hosek et al. | |
| 2007/0118308 A1* | 5/2007 | El-Ibiary | H02P 23/14 702/60 |
| 2008/0208429 A1* | 8/2008 | Saravanapriyan | F01K 13/02 701/100 |

OTHER PUBLICATIONS

Carpenter, Paul S., et al. "On algorithms for velocity estimation using discrete position encoders." Proceedings of IECON'95-21st Annual Conference on IEEE Industrial Electronics. vol. 2. IEEE, 1995.*

* cited by examiner

*Primary Examiner* — Saif A Alhija
(74) *Attorney, Agent, or Firm* — Loza & Loza, LLP; Thomas H. Ham

(57) ABSTRACT

A motion system and method for motion performance modeling and monitoring the motion system uses a baseline motion performance model of the motion system, which is created by collecting motor operating variables, to compare real-time motor operating variables with values of the baseline motion performance model to determine the performance state of the motion system.

12 Claims, 9 Drawing Sheets

MULTI-DIMENSIONAL MOTION PERFORMANCE MODELING AND REAL-TIME MONITORING OF A MOTION SYSTEM

CROSS REFERENCE TO RELATED APPLICATION

This application is entitled to the benefit of U.S. Provisional Patent Application Ser. Nos. 62/443,585, filed on Jan. 6, 2017, which is incorporated herein by reference.

BACKGROUND

An electric motor controller is designed to drive an electric motor to perform various motion requirements. An example is a single axis motor on a belt drive actuator doing various point-to-point motions with acceleration, constant speed, and deceleration. Another example is a motor performing a constant speed control moves, such as a conveyor or a fan.

An electric motor controller can be a standalone controller or a slave controller connected to a host controller, which issues various motion commands that are executed via the electric motor controller.

Typically, an electric motor controller performs closed loop servo control by reading the position and/or velocity values and varying the power supplied to the motor to meet the target motion performance. Besides performing the closed loop servo control, an electric motor controller can perform basic monitoring of the motion variables such as position error, peak current, and field-effect transistor (FET) temperature. When one of these variables goes outside of the set threshold value, a warning or an error handling routine can be performed. Such a type of monitoring can be considered as a single-dimensional monitoring where the individual motor related variables are typically monitored independent of other variables.

SUMMARY

A motion system and method for motion performance modeling and monitoring the motion system uses a baseline motion performance model of the motion system, which is created by collecting motor operating variables, to compare real-time motor operating variables with values of the baseline motion performance model to determine the performance state of the motion system.

A method for motion performance modeling and monitoring a motion system with an electric motor in accordance with an embodiment of the invention includes driving the electric motor to perform at least one sequence of motions, collecting motor operating variables as the electric motor is driven to perform the at least one sequence of motions, creating a baseline motion performance model of the motion system using the collected motor operating variables, operating the electric motor, collecting real-time motor operating variables as the electric motor is operated, and computing deviation values between values of the baseline motion performance model and the collected real-time motor operating variables to determine a performance state of the motion system. In some embodiments, the steps of this method are performed when program instructions contained in a non-transitory computer-readable storage medium is executed by one or more processors A motion system includes an electric motor, a motor controller to drive the electric motor to perform at least one sequence of motions and a motion performance modeling and monitoring (MPMM) module. The MPMM module is configured to collect motor operating variables as the electric motor is driven during a baseline modeling period and create a baseline motion performance model of the motion system using the collected motor operating variables. The MPMM is further configured to collect real-time motor operating variables as the electric motor is driven during a normal operating period, and compute deviation values between values of the baseline motion performance model and the collected real-time motor operating variables to determine a performance state of the motion system.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

In this disclosure, a new type of motion performance modeling and monitoring method for a motion system with an electric motor is described that, in an embodiment, uses multiple synchronously collected motion operating variables to create a multi-dimensional motion performance model and monitors in real-time any deviations from the multi-dimensional motion performance model.

This new multi-dimensional motion model is nontemporal and depends only on the synchronous collection of the set of variables or parameters. As long as the motion data sets are collected synchronously, the frequency of the data collection is not a factor in making an accurate multi-dimensional motion performance model and monitoring deviations from the model. For example, a data collected at many seconds interval or millisecond interval will result in the same multi-dimensional motion state model as long as enough synchronous data points are collected. Once the multi-dimensional motion performance model is generated, this model is used on a motor controller or a host controller, or even on a cloud to monitor deviations from the model at any frequency and achieve accuracy in monitoring.

Figure 1:
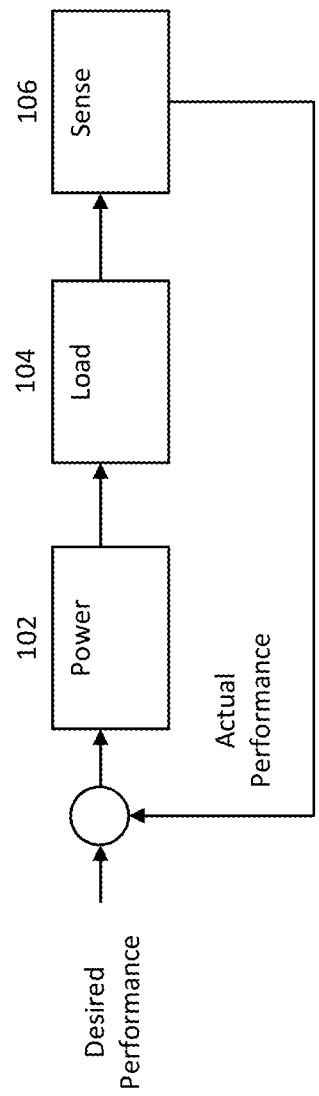
FIG. 1 is a diagram illustrating a typical closed-loop servo control for a typical electric motor in accordance with prior art.

FIG. 1 is a diagram illustrating a typical closed-loop servo control for a common electric motor. As illustrated in FIG. 1, the electrical motor converts supplied power 102, i.e., voltage and current, to physical mechanical movement of a load 104. The electric motor, which has sensors (e.g., encoder, resolver, hall sensor, etc.), senses 106 the motion of the load using the sensors connected to the motor or the load. As illustrated in FIG. 1, in a closed-loop control algorithm, the difference between the desired and actual motor performance is calculated and corresponding power is applied to the motor to move the load to achieve the desired performance. This cycle is repeated to create a closed-loop motion servo system.

The power value is made up of the voltage and the current that are applied to the electric motor using the equation, Power=Voltage×Current. Typically, the voltage power supply is kept at constant and the motor current is typically regulated to control the amount of power applied to the motor. The load value is typically represented by the mass that needs to be moved. The value of the mass can be a constant fixed value or a varying value, depending on the application. The load value is typically known by the host controller since it controls the sequence of the whole system. The sense value is typically a position or a velocity value that is collected from an encoder, a resolver or a hall sensor. If an encoder is used, the encoder can be an incremental type or an absolute type.

In an embodiment, for building the multi-dimensional motion model, following variables or parameters available on the motor controller are used:
1. Motor Current (controlled variable)
2. Motor Position (observed variable)
3. Motor Velocity (observed variable)
4. Motor Load (observed variable)

Of these variables, the motor current variable is the main variable that is actively controlled and changed according to the motion requirements. The motor position and motor velocity variables are the sensed or observed variables. The motor load can change with the motor position but still is considered as an observed variable.

The environmental variables such as temperature, pressure, and humidity may affect the performance of the model and can be added as additional variable to be used in building higher dimensional motion state model.

To build the multi-dimensional motion state model of $4^{th}$ dimension, following four variables are synchronously collected at each moment in time from the motor controller:
1. Motor current—Vc
2. Motor Position—Vp
3. Motor Velocity—Vv
4. Motor Load—Vl As noted previously, the motor current variable Vc is the variable that is actively controlled and changed accordingly by the motor controller depending on the other observable variables: position, velocity, and load.

To create a multi-dimensional motion performance model, a number of set of variables are collected over a time at any time interval while the motion system is performing its normal operation. Following arrays of points will be collected.

| i | Vc | Vp | Vv | Vl |
|---|------|------|------|------|
| 0 | Vc[0] | Vp[0] | Vv[0] | Vl[0] |
| 1 | Vc[1] | Vp[1] | Vv[1] | Vl[1] |
| 2 | Vc[2] | Vp[2] | Vv[2] | Vl[2] |
| 3 | Vc[3] | Vp[3] | Vv[3] | Vl[3] |
| . | . | . | . | . |
| . | . | . | . | . |
| . | . | . | . | . |
| n | Vc[n] | Vp[n] | Vv[n] | Vl[n] |

Note that the interval time between collection points is not specified and can be any interval value. Shorter the interval between the collections, higher the resolution will be for the model and less time it takes to build a model. Longer the interval, longer time will be required to build a similar model. But the accuracy of the model does not depend on the frequency of the collection interval. The only requirement is that the variables are collected synchronously at the same time.

Once enough set of points are gathered that represents the whole range of motion, the points are organized and clustered to form a multi-dimensional model (MDM) that will represent the baseline or a "Normal" motion performance model.

Once the baseline multi-dimensional motion model MDM is made of the motion system, this model can be used in real-time to monitor and compare with the real-time motion variables. Similar to the only requirement to build the model, the only requirement for the real-time monitoring is that the motion variables are collected synchronously at the same time. Frequency of the motion variable collection does not matter and can be done on the motor controller at a high frequency or at lower frequency on the host or at super low frequency on the cloud.

Since motor current Vc is the control variable that is changed according to the other observed variables Vp, Vv, Vl, the multi-dimensional motion model can be represented by following function.

$$Vc=MDM(Vp,Vv,Vl)$$

From the above function, at any synchronously collected position, velocity and load values, the motor current value (or power) is determined.

Following are potential types of deviation and potential issues with the motion system that can be observed from the MDM monitoring.

| Observation of difference between Vc (MDM) and Vc (real-time) | Potential issues with the motion system |
|---|---|
| Steady overall increase | Decreased Lubrication<br>Bearing degradation |
| Localized increase | System obstruction<br>Localized system degradation<br>Localized jam |
| Decrease at speed direction change | Backlash increase<br>Belt Degradation<br>Slippage |
| Decrease at certain position and velocity | Slippage<br>Belt Degradation |

Overall deviation values can be averaged or summed and trended to determine a single value that represents the overall "health" value of the motion system. For example, a normalized real-time summed deviation value can range from 0 to 100 that represents healthy to unhealthy state of the motion system. In this example, a user can enter the maximum summed deviation value that represent the 100 normalized value. Thus, if the absolute summed deviation value is greater than the maximum summed deviation value, then the normalized real-time summed deviation value will still be 100.

Figure 2:
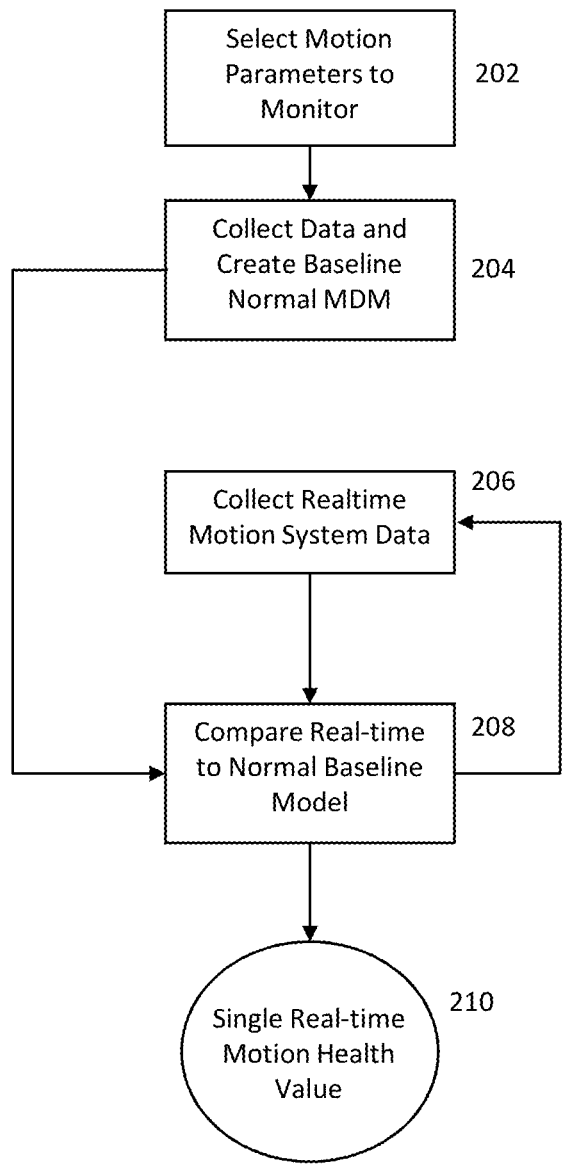
FIG. 2 is a flow chart illustrating an operation of a motion performance modeling and monitoring module in accordance with an embodiment of the invention.

The operation of a motion system with motion performance modeling and monitoring capabilities in accordance with an embodiment of the invention is described with reference to a flow chart of FIG. 2. At block 202, the motion system selects motion parameters to be monitored that are needed created a model and determine the health of the motion system using the model. These motion parameters may include, but not limited to, motor current Vc, motor position Vp, motor velocity Vv and motor load Vl. The motion parameters to be monitored may be input by a user or predefined as default parameters.

Next, at block 204, the motion system collects data for the selected motion parameters as the motion system operates for a predefined baseline modeling period, and creates a baseline normal MDM using the collected data. The baseline normal MDM can now be used as a reference to determine the health of the motion system.

Next, at block 206, the motion system collects real-time data for the selected motion parameters as the motion system operates in its normal operation during a normal operating period. The motion system may collect the real-time data at any frequency, such as every few milliseconds or every few seconds.

Next, at block 208, the motion system compares the collected real-time data to the normal baseline MDM. In an embodiment, difference between the collected real-time motor current Vc and the MDM motor current Vc for the same motor position Vp, motor velocity Vv and motor load Vl is computed to make the comparison.

Next, at block 210, the motion system computes a single real-time motion health value that represents the overall "health" of the motion system using the comparison of the collected real-time data to the normal baseline MDM. In an embodiment, the deviation values with respect to motion current can be averaged or summed (and normalized) and trended to determine the single real-time motion health value.

Figure 3:
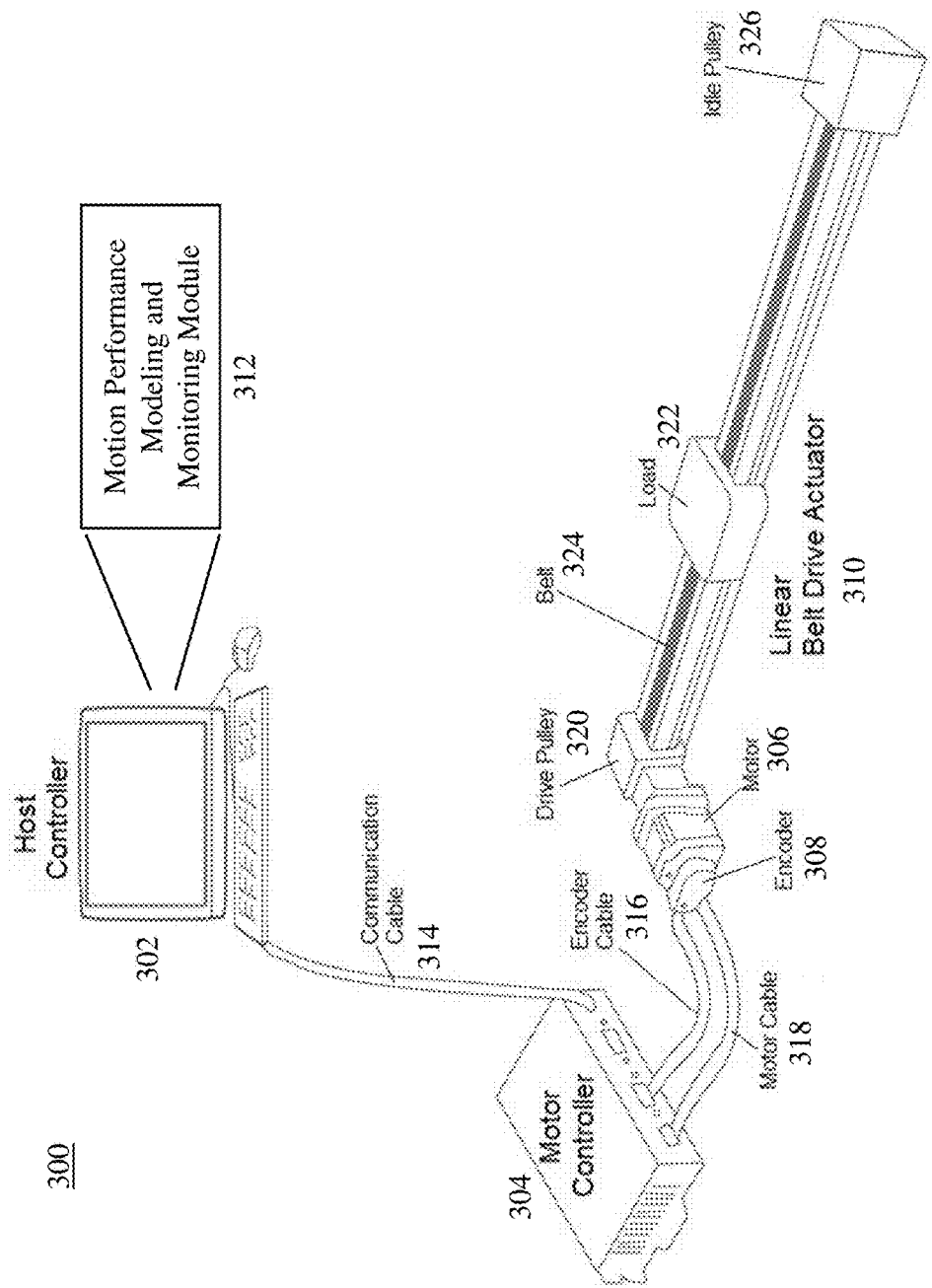
FIG. 3 is a diagram of a linear motion system in accordance with an embodiment of the invention.

Turning now to FIG. 3, a motion system 300 in accordance with an embodiment of the invention is illustrated. As shown in FIG. 3, the motion system 300 includes a host controller 302, a motor controller 304, an electric motor 306 with an encoder 308, and a linear belt drive actuator 310. In this embodiment, a motion performance modeling and monitoring (MPMM) module 312 is included in the host controller 302 as a program running in the motor controller using one or more processors. However, in other embodiments, the MPMM module may be included in the motor controller 304, which may be operating as a standalone device without any host controller. In such embodiments, the MPMM module may be implemented in any combination of software and hardware. In the illustrated embodiment, the MPMM module uses three motion variables: two observation variables, motor position and motor velocity, and one controlled variable, the motor current. Using these three variables, 3-dimensional (3D) motion performance state model can be created. In this embodiment, the load variable will be assumed to be constant and will not be used in the model building.

The host controller 302 operates to control the motion system 300. The host controller may be a personal computer with programs to control the motion system via the motor controller 304. Thus, the host controller may include components commonly found in a personal computer, such as CPU, memory, nonvolatile storage and input devices, e.g., mouse and keyboard. The host controller communicates with the motor controller through typical communication means, such as USB, Serial, or Ethernet communication cable 314.

The motor controller 304 controls the electric motor 306 by reading position data from the encoder 308 via an encoder cable 316 and supplying appropriate power to the electric motor via a motor cable 318 to drive the electric motor. Such a motor controller is known, and thus, components of the motor controller are not described herein in detail.

The electric motor 306 includes a shaft (not shown), which is connected to a belt drive pulley 320 of the linear belt drive actuator 310. As the motor shaft is rotated, the belt drive pulley moves a load attached to a wheel plate 322 using a belt 324 connected to the belt drive pulley and an idle pulley 326 to perform sequences of motion.

In operation, the host controller 302 issues a motion sequence command to the motor controller 304 so that the motor controller can drive the electric motor 306. In addition to sending the motion sequence command, the host controller (i.e., the MPMM module 312) collects following three variable values from the motor controller synchronously: motor position value, motor velocity value and motor current value. Thus, the motor controller executes motion sequences when commands for the motion sequences are sent to the motor controller from the host controller. An example of two standalone motion sequences executed by the motor controller in response to commands from the host controller in one embodiment is illustrated in a flowchart of FIG. 4.

Figure 4:
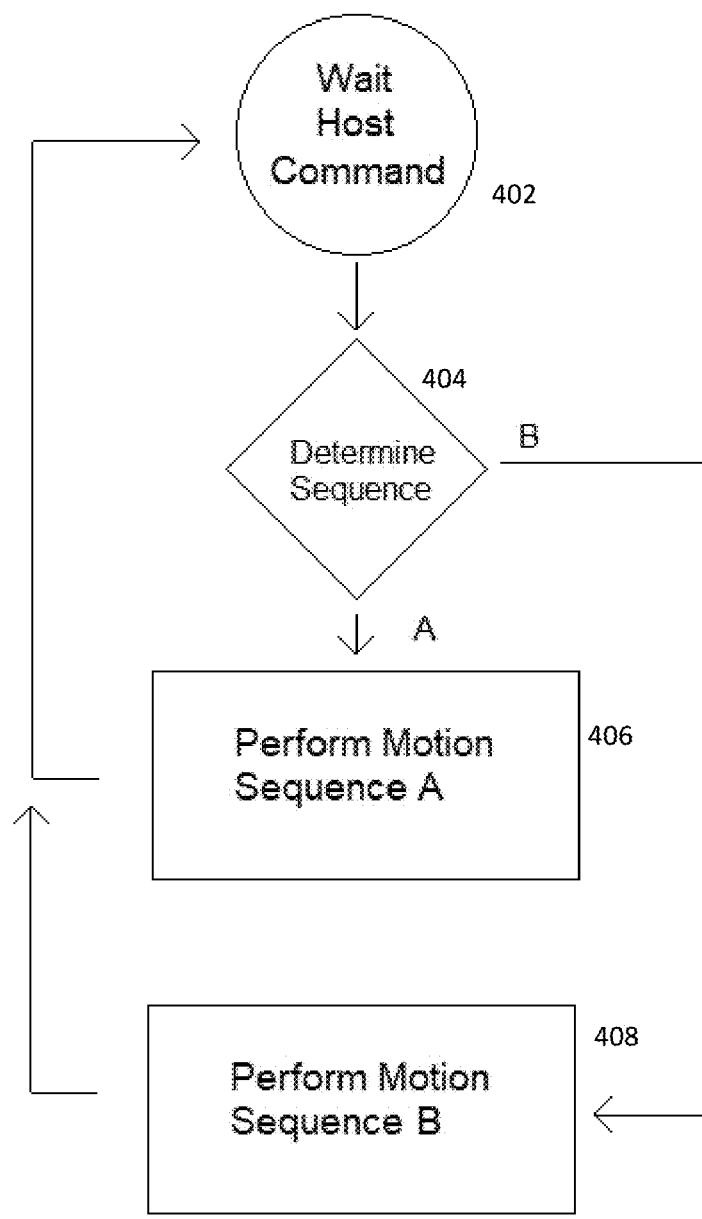
FIG. 4 is a process flow diagram of an example of two standalone motion sequences executed by the motor controller of the linear motion system of FIG. 3 in accordance with one embodiment of the invention.

As shown in FIG. 4, at block 402, the motor controller 304 waits for a command from the host controller 302. When a command is received, the motor controller determines a sequence of motions from the received command, at block 404. The sequence of motions may include one or more motions that are to be executed via the electric motor 306 of the motion system 300. For the first command, the motor controller determines a sequence A of motions, and thus, the motor controller executes the sequence A of motions, at block 406. The operation then proceeds back to block 402, where the motor controller waits for another command from the host controller.

For the second command, the motor controller 304 determines a sequence B of motions, and thus, the motor controller executes the sequence B of motions, at block 408. The operation then proceeds back to block 402, where the motor controller waits for another command from the host controller 302. In this fashion, the motor controller executes different sequences of motions in response to commands from the host controller.

In addition, to issuing motion sequence commands, the host controller 302 (i.e., the MPMM module 312) also synchronously reads the three sets of variables: motor position, motor velocity, and motor current. Using these three variables, a 3D plots can be generated as the variables are collected by the host controller from the motor controller 304. An example of such 3D plots are shown in FIG. 5.

Figure 5:
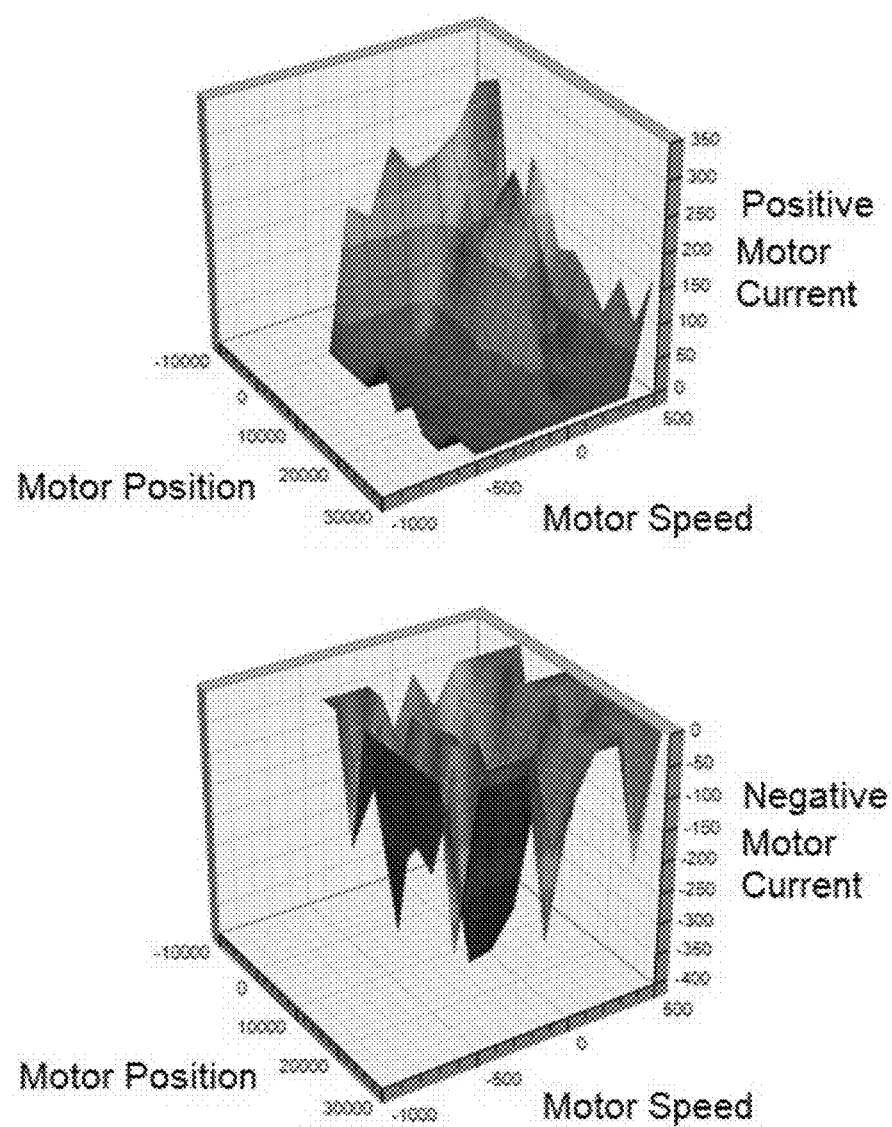
FIG. 5 shows two three-dimensional (3D) plots of motor position, motor speed and motor current generated by a motion performance modeling and monitoring (MPMM) module of the linear motion system in accordance with an embodiment of the invention.

In the 3D plots of FIG. 5, the horizontal X and Y axes are the Motor Position and Motor Speed axes, while the vertical Z axis is the Motor Current axis. The top graph in FIG. 5 shows the maximum positive motor current values per position and velocity values. The bottom graph in FIG. 5 shows the minimum negative motor current values per position and velocity values. Thus, this model uses the maximum positive and minimum negative motor current values per pairs of position and velocity values. In other implementations, instead of the maximum and minimum motor current values, average positive or negative current values can also be used to create the model.

Once enough values are collected, the model will come to a steady state with little or no change. The steady state motion performance model can now be considered as the normal or "healthy" motion performance model. Note that the frequency of the collection does not affect the accuracy of the model. One important requirement is that the set of variables (position, velocity, and current) must be collected synchronously at the same time.

To create an accurate model, enough data points must be collected to cover the full range of the position and velocity of all the motion sequences. Once the normal or the "healthy" model is created, this model can be used as a baseline model to monitor and compare in real-time to determine the dynamic real-time health state of the motion system.

By collecting real-time values of motor position, motor velocity, and motor current, deviation values can be computed. In an embodiment, the deviation values are differences between motor current values of the collected data and the "healthy" model for the same pair of motor position and motor velocity values. These deviation values can then be used to create a 3D Dynamic Deviation Model, which represent the current health of the motion system. On the 3D Dynamic Deviation Model, a flat plane represents no deviation from the "healthy" model, which means that the motion system is "healthy", and a non-flat shape represents various degrees of deviations from the "healthy" model, which means that the motion system is not as "healthy". The deviation values at various motor position and motor speed values can be summed (or averaged) and normalized to create a single value that represents the overall health or the current performance state of the motion system. This single health value can range from 0 to 100, representing zero deviation (healthy) to maximum deviations (unhealthy). Once the single health value is determined, this value can easily be handled and shared across the host or cloud controllers with minimum communication load.

Figure 6A:
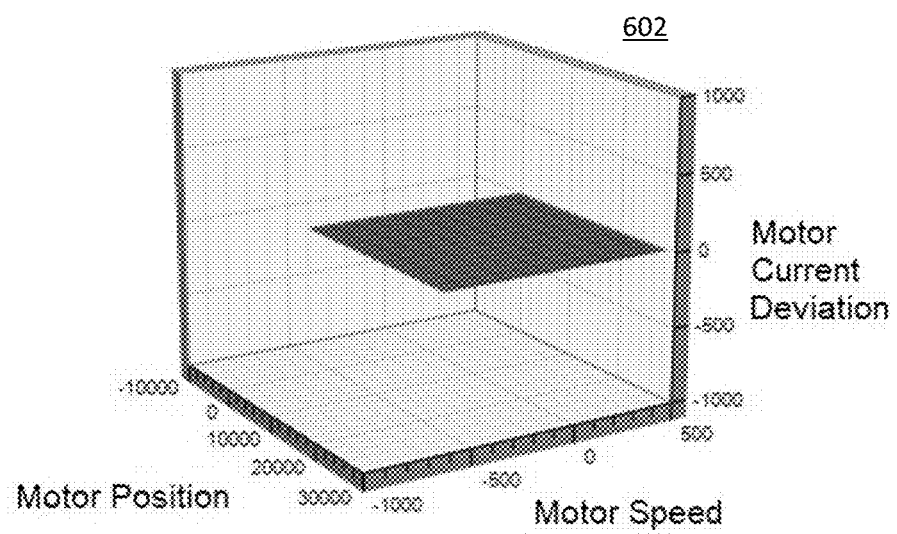
FIG. 6A illustrates an example of a 3D dynamic deviation model and a single health value gauge for a healthy motion system in accordance with an embodiment of the invention.
Figure 6A:
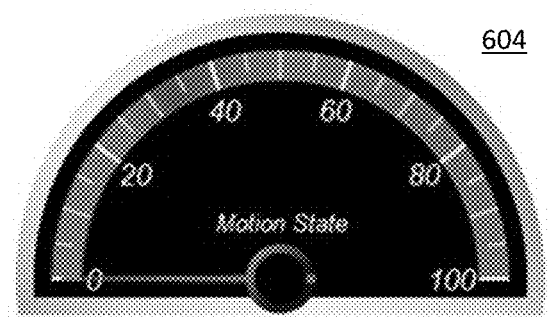

FIG. 6A illustrates an example of a 3D Dynamic Deviation Model 602 and a single health value gauge 604 for a healthy motion system. The 3D Dynamic Deviation Model 602 of FIG. 6A shows a flat plane, which represents no deviation from the "healthy" model. In addition, the single health value gauge 604 of FIG. 6A indicates a single health value of zero. Thus, the motion system can be determined to be "healthy".

Figure 6B:
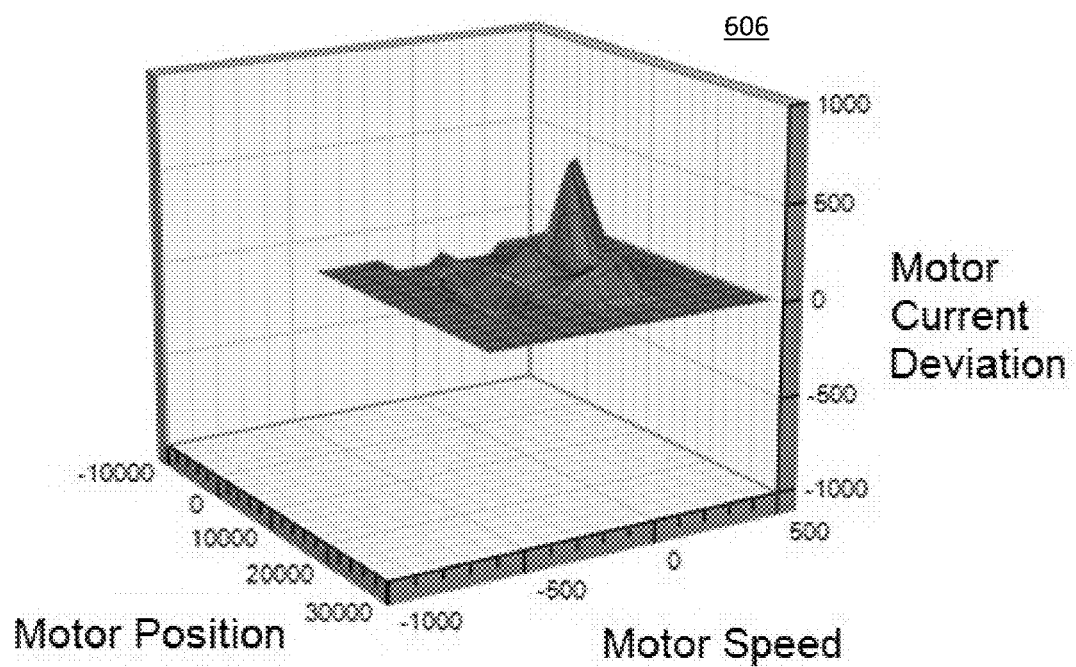
FIG. 6B illustrates an example of a 3D dynamic deviation model and a single health value gauge for an unhealthy motion system in accordance with an embodiment of the invention.
Figure 6B:
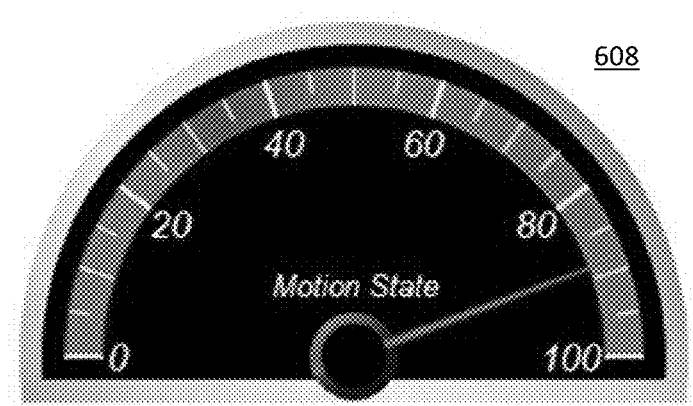

FIG. 6B illustrates an example of a 3D Dynamic Deviation Model 606 and a single health value gauge 608 for an unhealthy motion system. The 3D Dynamic Deviation Model 606 of FIG. 6B shows a non-flat surface, which represents deviations from the "healthy" model. In addition, the single health value gauge 608 of FIG. 6B indicates a single health value of approximately 89. Thus, the motion system can be determined to be "unhealthy".

Figure 7:
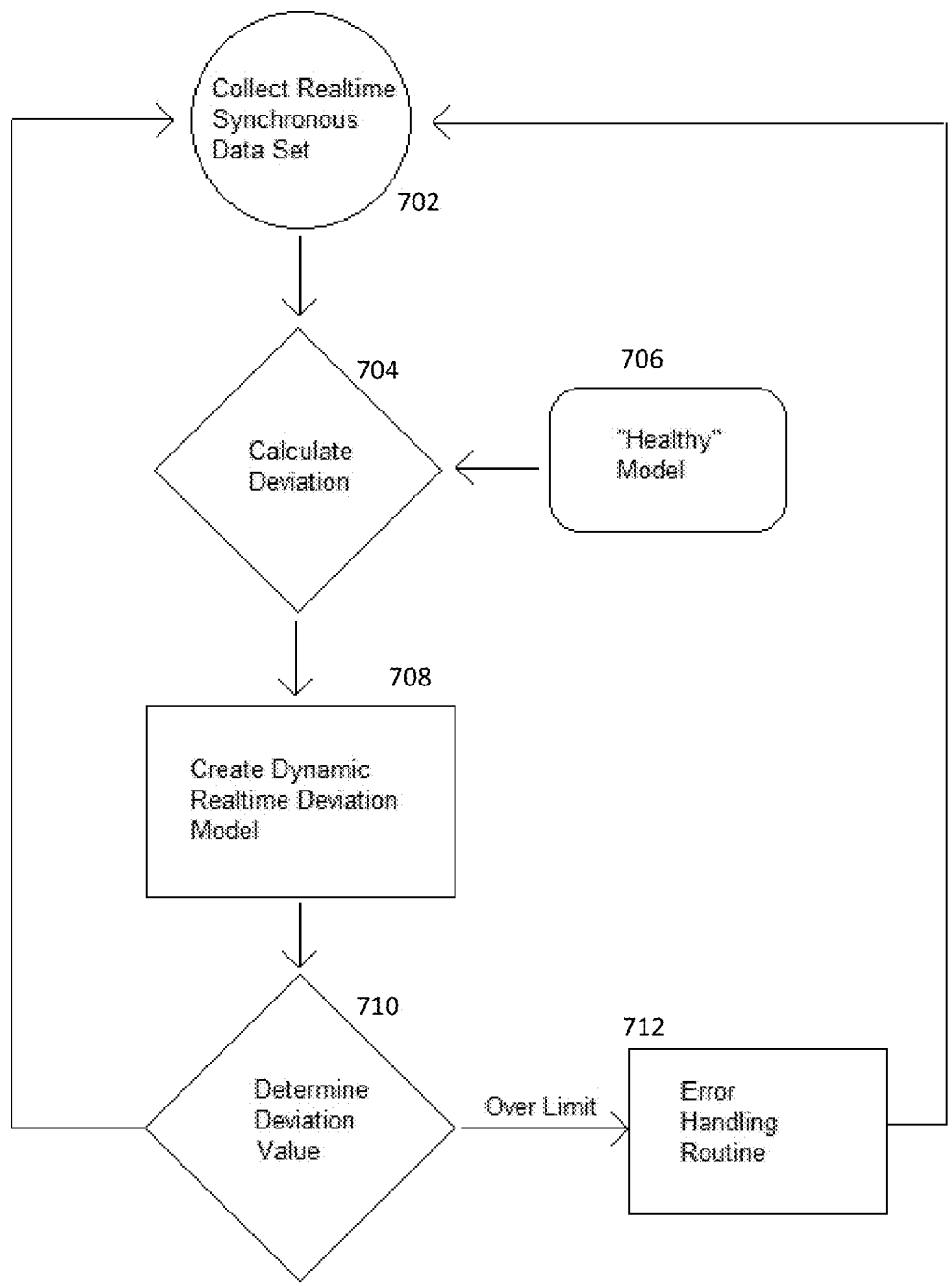
FIG. 7 is a process flow diagram of a motion performance state monitoring operation performed by the MPMM module of the linear motion system of FIG. 3 in accordance with an embodiment of the invention.

The motion performance state monitoring operation of the motion system 300 in accordance with an embodiment of the invention is now described with reference to a process flow diagram of FIG. 7. At block 702, the host controller 302 (i.e., the MPMM module 312) collects real-time synchronous data set, e.g., motor position, motor velocity, and motor current, from the motor controller 304.

Next, at block 704, the host controller 302 (i.e., the MPMM module 312) calculates deviations between the collected real-time synchronous data set and the "healthy" model 706. In an embodiment, deviation values are differences between motor current values of the collected data and motor current values of the "healthy" model for the same pair of motor position and motor velocity values.

Next, at block 708, the host controller 302 (i.e., the MPMM module 312) creates dynamic real-time deviation model using the calculated deviation values. In an embodiment, the host controller creates 3D dynamic real-time deviation model, as illustrated in FIGS. 6A and 6B Next, at block 710, the host controller 302 (i.e., the MPMM module 312) determines a single health value, which may be a normalized summed deviation value. The single health value may be visually displayed on a single health value gauge, as illustrated in FIGS. 6A and 6B. If the single health value is over a predefined limit, the host controller may execute an error handling routine, at block 712, which may involve presenting a warning and/or stopping the motion system from executing any additional motions.

In some implementations, a grid array of the motor position and velocity values may be used by the MPMM module 312, where positive and negative motor current are assigned per grid. As an example, let's assume that the motor position range is from −1,000 to 3,000 and the motor velocity range is from −500 to 500. In this example, if 10×10 grid is used for the position and velocity range, the position grid increment values will go from −1,000 to 3,000 in 400 increments (4,000/10), and the velocity grid increment values will go from −500 to 500 in 100 increments (1,000/10). Then, two 10×10 array values are created for the positive and negative current values. Positive current value for each grid can be the maximum or average positive current value detected in that grid. Same with negative current value, which is the minimum or average negative current detected in that grid. Using this method, the model is created. Grid array can be small or large, depending on the desired size and complexity of the model. For example, a simple 2×2 grid may be used to create a small and simple model. As another example, a rectangular 100×50 grid may be used to create a larger and more complex model. Thus, the MPMM module 312 allows for scalability, where the model may be customized from simple to complex model depending on the desired resource and complexity.

In an embodiment, monitoring of the real-time values with the model is executed at regular frequency. When deviation value is detected, it is stored in the assigned grid. At next monitoring frequency, deviation values are gradually decreased at certain rate for each grid value. For example, the decays rate of 50% of the previous rate may be set. In this example, if the grid value at a certain grid is 80, that grid value is decreased to 40 and then 20, 10, 5, 2, 1, 0 at each monitoring frequency. However, if a value at that grid value that is higher than the current value is detected, then the higher value is used to decay at next monitoring frequency. Without this feature, the grid values would be changing one grid at a time with all the values zero and one grid value changing at a time. Thus, the MPMM module 312 uses a sensitivity value for the real-time monitoring that is applied to each deviation grid value. The sensitivity value ranges from 0.99 to 0. A sensitivity value of 0.99 will have a very slow decay rate and a sensitive value of 0 will have no decay rate.

Figure 8:
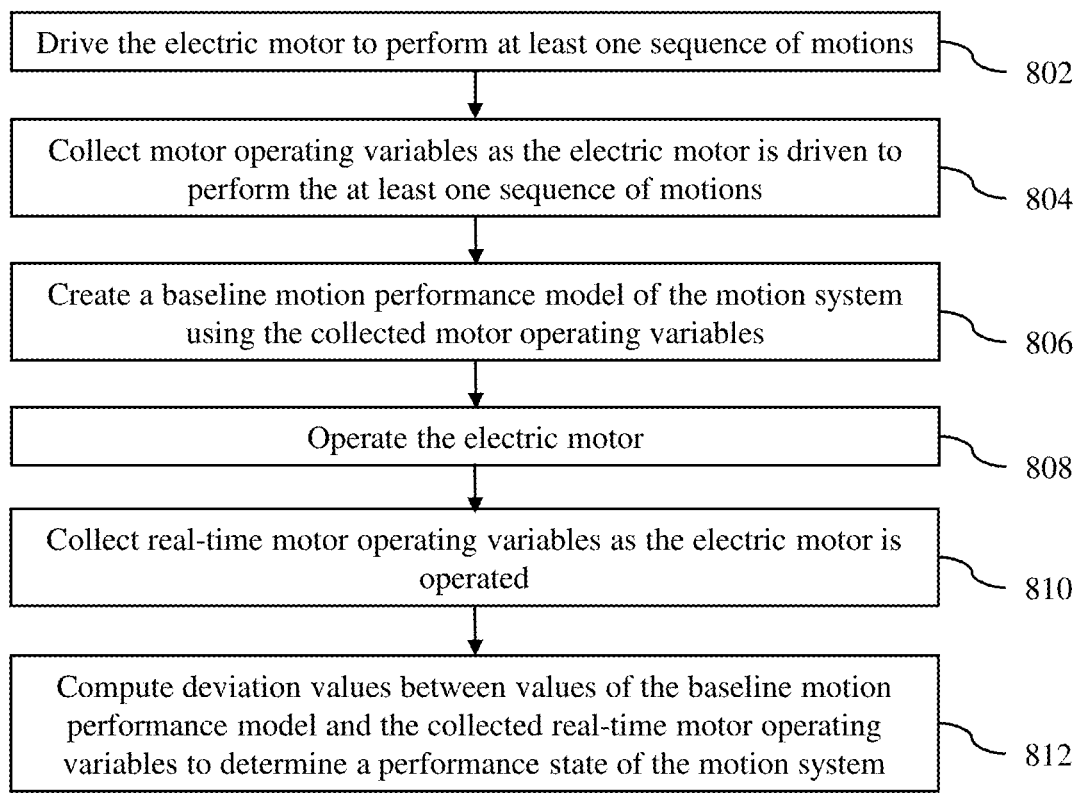
FIG. 8 is a flow diagram of a method for motion performance modeling and monitoring a motion system with an electric motor in accordance with an embodiment of the invention.

A method for motion performance modeling and monitoring a motion system with an electric motor in accordance with an embodiment of the invention is described with reference to a flow diagram of FIG. 8. At block 802, the electric motor is driven to perform at least one sequence of motions. At block 804, motor operating variables are collected as the electric motor is driven to perform the at least one sequence of motions. At block 806, a baseline motion performance model of the motion system is created using the collected motor operating variable. At block 808, the electric motor is operated. At block 810, real-time motor operating variables are collected as the electric motor is operated. At block 812, deviation values between values of the baseline motion performance model and the collected real-time motor operating variables are computed to determine a performance state of the motion system.

The components of the embodiments as generally described in this document and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Furthermore, embodiments of at least portions of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, non-volatile memory, NVMe device, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for motion performance modeling and monitoring a motion system with an electric motor, the method comprising:
   driving the electric motor to perform at least one sequence of motions;
   collecting multiple sets of motor operating variables as the electric motor is driven to perform the at least one sequence of motions, wherein each of the multiple sets of motor operating variables includes at least a motor current value, a motor position value and a motor velocity values that are synchronously collected at each moment in time, wherein the motor current value represents a current that is applied to drive the electric motor and the motor position value represents position data from an encoder;

creating a baseline motion performance model of the motion system using the collected multiple sets of motor operating variables, wherein the baseline motion performance model includes points defined by the multiple sets of motor operating variables, each of the points representing at least one motor current value, one motor position value and one motor velocity value that were synchronously collected, wherein the baseline motion performance model of the motion system is a three-dimensional baseline motion performance model and wherein each of the points of the baseline motion performance model is represented by one motor current value, one motor position value and one motor velocity value, wherein creating the baseline motion performance model includes using an n by m grid defined by ranges of motor position values and motor velocity values, wherein first n by m array values are created for positive motor current values as maximum or average positive values and second n by m array values are created for negative motor current values as minimum or average negative values;

after the baseline motion performance model of the motion system has been created, operating the electric motor;

collecting multiple sets of real-time motor operating variables as the electric motor is operated, wherein each of the multiple sets of real-time motor operating variables includes at least a real-time motor current value, a real-time motor position value and a real-time motor velocity values that are synchronously collected; and computing deviation values between values of the baseline motion performance model and the collected real-time motor operating variables to determine a performance state of the motion system, wherein each deviation value is a difference between one real-time motor current values and a corresponding motor current value for a same pair of motor position and motor velocity values.

2. The method of claim 1, wherein collecting the real-time motor operating variables as the electric motor is operated is periodically executed at any frequency.

3. The method of claim 1, further comprising summing the deviation values to compute a single summed real-time health value for the motion system that indicates a health state of the motion system.

4. The method of claim 1, further comprising creating a three-dimensional deviation model using the deviation values, wherein the motion system is indicated as being healthy when the three-dimensional deviation module shows a flat surface and wherein the motion system is indicated as being unhealthy when the three-dimensional deviation module shows a non-flat surface.

5. A non-transitory computer-readable storage medium containing program instructions for motion performance modeling and monitoring a motion system with an electric motor, wherein execution of the program instructions by one or more processors of a computer system causes the one or more processors to perform steps comprising:

driving the electric motor to perform at least one sequence of motions;

collecting multiple sets of motor operating variables as the electric motor is driven to perform the at least one sequence of motions, wherein each of the multiple sets of motor operating variables includes at least a motor current value, a motor position value and a motor velocity values that are synchronously collected at each moment in time, wherein the motor current value represents a current that is applied to drive the electric motor and the motor position value represents position data from an encoder;

creating a baseline motion performance model of the motion system using the collected multiple sets of motor operating variables, wherein the baseline motion performance model includes points defined by the multiple sets of motor operating variables, each of the points representing at least one motor current value, one motor position value and one motor velocity value that were synchronously collected, wherein the baseline motion performance model of the motion system is a three-dimensional baseline motion performance model and wherein each of the points of the baseline motion performance model is represented by one motor current value, one motor position value and one motor velocity value, wherein creating the baseline motion performance model includes using an n by m grid defined by ranges of motor position values and motor velocity values, wherein first n by m array values are created for positive motor current values as maximum or average positive values and second n by m array values are created for negative motor current values as minimum or average negative values;

after the baseline motion performance model of the motion system has been created, operating the electric motor;

collecting multiple sets of real-time motor operating variables as the electric motor is operated, wherein each of the multiple sets of real-time motor operating variables includes at least a real-time motor current value, a real-time motor position value and a real-time motor velocity values that are synchronously collected; and computing deviation values between values of the baseline motion performance model and the collected real-time motor operating variables to determine a performance state of the motion system, wherein each deviation value is a difference between one real-time motor current values and a corresponding motor current value for a same pair of motor position and motor velocity values.

6. The computer-readable storage medium of claim 5, wherein synchronously collecting the real-time motor operating variables as the electric motor is operated is periodically executed at any frequency.

7. The computer-readable storage medium of claim 5, wherein the steps further comprise summing the deviation values to compute a single summed real-time health value for the motion system that indicates a health state of the motion system.

8. The computer-readable storage medium of claim 5, wherein the steps further comprise creating a three-dimensional deviation model using the deviation values, wherein the motion system is indicated as being healthy when the three-dimensional deviation module shows a flat surface and wherein the motion system is indicated as being unhealthy when the three-dimensional deviation module shows a non-flat surface.

9. A motion system comprising:

an electric motor;

a motor controller configured to drive the electric motor to perform at least one sequence of motions; and a motion performance modeling and monitoring (MPMM) module, the MPMM module being configured to:

collect multiple sets of motor operating variables as the electric motor is driven during a baseline modeling period, wherein each of the multiple sets of motor operating variables includes at least a motor current value, a motor position value and a motor velocity values that are synchronously collected at each moment in time, wherein the motor current value represents a current that is applied to drive the electric motor and the motor position value represents position data from an encoder;

create a baseline motion performance model of the motion system using the collected multiple sets of motor operating variables, wherein the baseline motion performance model includes points defined by the multiple sets of motor operating variables, each of the points representing at least the motor current value, the motor position value and that motor velocity values that were synchronously collected, wherein the baseline motion performance model of the motion system is a three-dimensional baseline motion performance model and wherein each of the points of the baseline motion performance model is represented by one motor current value, one motor position value and one motor velocity value, wherein the baseline motion performance model is created using an n by m grid defined by ranges of motor position values and motor velocity values, wherein first n by m array values are created for positive motor current values as maximum or average positive values and second n by m array values are created for negative motor current values as minimum or average negative values;

after the baseline motion performance model of the motion system has been created, collect multiple sets of real-time motor operating variables as the electric motor is driven during a normal operating period, wherein each of the multiple sets of real-time motor operating variables includes at least a real-time motor current value, a real-time motor position value and a real-time motor velocity values that are synchronously collected; and compute deviation values between values of the baseline motion performance model and the collected real-time motor operating variables to determine a performance state of the motion system, wherein each deviation value is a difference between one real-time motor current values and a corresponding motor current value for a same pair of motor position and motor velocity values.

10. The motion system of claim 9, wherein the MPMM module is configured to synchronously collect the real-time motor operating variables periodically at any frequency.

11. The motion system of claim 9, wherein the MPMM module is further configured to sum the deviation values to compute a single summed real-time health value for the motion system that indicates a health state of the motion system.

12. The motion system of claim 9, wherein the MPMM module is further configured to create a three-dimensional deviation model using the deviation values, wherein the motion system is indicated as being healthy when the three-dimensional deviation module shows a flat surface and wherein the motion system is indicated as being unhealthy when the three-dimensional deviation module shows a non-flat surface.

* * * * *